Jan. 17, 1950 J. VAHLE 2,494,596

VARIABLE REACTANCE DEVICE

Filed Nov. 26, 1948 2 Sheets-Sheet 1

Inventor:
Julius Vahle,
by
His Attorney.

Inventor:
Julius Vahle,
by Claude H. Matt
His Attorney.

Patented Jan. 17, 1950

2,494,596

UNITED STATES PATENT OFFICE 2,494,596

VARIABLE REACTANCE DEVICE

Julius Vahle, Syracuse, N. Y., assignor to General Electric Company, a corporation of New York Application November 26, 1948, Serial No. 62,171

3 Claims. (Cl. 171—242)

This invention relates to variable reactance devices, and more particularly to variable reactance devices of the type used in high frequency electrical circuits for tuning and other purposes. The principal object of my invention is the provision of a device of this character which has a low value of reactance and at the same time is without moving electrical contacts.

Variable reactance devices are well known wherever high frequency electrical energy is used in both the power and communications fields. High frequency circuits almost invariably require tuning and such tuning is normally accomplished by the use of a variable reactance device, either inductive, capacitive or a combination of both. Such devices, particularly those of the inductive type, customarily have moving electrical contacts. However, when a variable reactance device of the inductive type must have a very low value of reactance it is desirable that moving electrical contacts be eliminated from the device in order to reduce contact resistance and its resulting power loss, and to eliminate wear on the moving parts. This is particularly important when the variable reactance device is subject to continual variation such as occurs in an automatic tuning system. An example of such a tuning system is that disclosed in application Serial No. 62,173 of Julius Vahle and Paul D. Heath filed concurrently herewith and assigned to the assignee of the present invention. This automatic tuning system is used with a high frequency heater whose load electrodes have a large amount of capacitance with a resulting low value of capacitive reactance, requiring a low value of inductive reactance in parallel therewith for tuning. My invention provides a device which meets this need without the use of moving electrical contacts.

Figure 3:
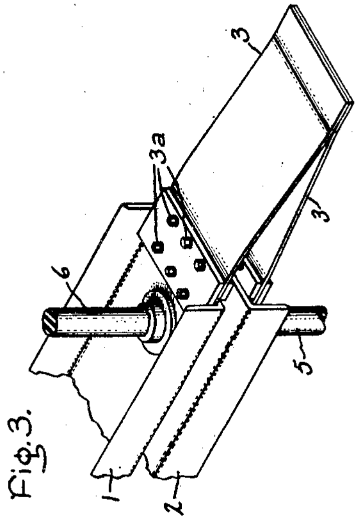

In carrying out my invention in one form I provide two flat electrically conductive plates each having a length less than one quarter of the wave length of the frequency being employed. The two plates are mounted in parallel spaced relation in a manner such that they form a transmission line having a length less than one quarter wave length. One end of the transmission line is open while the other is short-circuited by a flexible connection of electrically conductive material. One plate of the device is fixed while the second plate is arranged to be varied by means of a rack and pinion mechanism driven by a reversible electrical motor. Through the movement of one plate the spacing between the two plates can be varied over a range of several inches. An increase in the space between the two plates increases the inductive reactance of the device while a decrease in the spacing decreases the inductive reactance. For a more complete understanding of my invention, reference should be had to the accompanying drawing Fig. 1 of which is a rear elevation of two of the devices of my invention housed in a single enclosure, while Fig. 2 is an end view of one of the devices along the line 2—2 of Fig. 1, Fig. 3 is a detailed view of the flexible connection between the two parallel plates of my device, and Fig. 4 comprises two curves showing the comparison of characteristic impedances of a flat plate device of my invention with a comparable device having round conductors.

Figure 1:
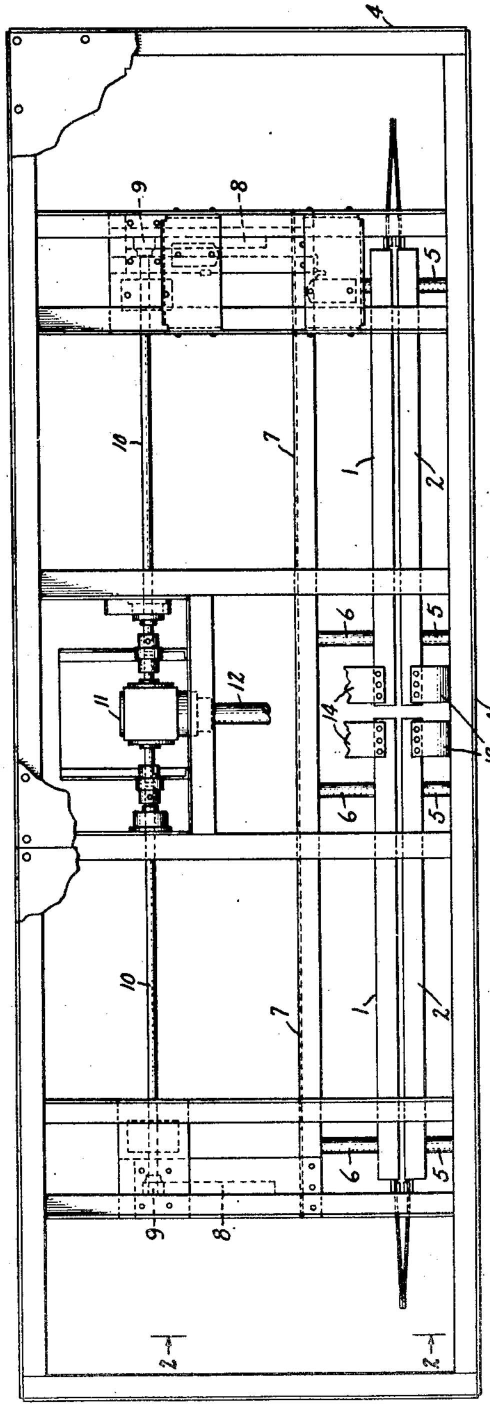
Figure 2:
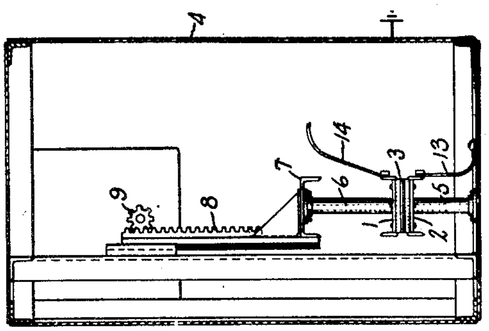

In Fig. 1 of the drawing, two of the variable reactance devices of my invention, each comprising upper plate 1 and lower plate 2 joined by flexible connector 3, are shown in a common enclosing case 4. The use of two of these devices in one cabinet does not affect the invention except to halve the amount of reactance when the two are operated in parallel. In this typical embodiment of my invention, both of the variable reactance devices are operated simultaneously by a common operating mechanism which is described in detail below.

Both upper plate 1 and lower plate 2 are of electrically conductive material preferably copper. Lower plate 2 is rigidly mounted on electrically insulating supports 5. This is best seen in Fig. 2 of the accompanying drawing which is an end view of one of the devices of my invention along the line 2—2 of Fig. 1.

Upper plate 1 is suspended in parallel spaced relation with lower plate 2 by electrically insulating members 6 from a rigid supporting member 7. Member 7 is securely fastened to racks 8 which are driven by pinions 9. Pinions 9 in turn are driven by a reversible electric motor or other suitable means (not shown) through horizontal shafts 10, a gear box 11 and a vertical shaft 12.

Flexible connector 3 which joins upper plate 1 to lower plate 2 is best seen in Fig. 3. Flexible connector 3 is of electrically conductive material such as copper and is securely fastened to plate 1 by nuts and bolts 3*a* and to plate 2 by similar nuts and bolts.

In a typical embodiment of my invention lower plate 2 is connected to enclosure 4, which is of electrically conductive material, and thence to ground potential by an electrically conductive connection 13. Upper plate 1 is connected to the ungrounded side of the high frequency circuit (not shown) by means of flexible electrically conductive connection 14.

In a typical apparatus embodying the device of my invention, which utilizes high frequency energy at approximately 13.5 megacycles, the air space between plate 1 and plate 2 may be variable from 3/8 inch to 10 inches. Plates 1 and 2 are normally of the same horizontal dimensions and in this typical case the width of the flat surface facing the opposite plate may be 5 inches and the length of the same flat surface 45 inches. Both of plates 1 and 2 have vertical projections along the sides of the horizontal surface not directly opposed to the other plate, to provide additional strength and rigidity.

Considering the device of my invention as a short circuited section of transmission line less than one quarter wave length long, the input reactance $X_L$ to the line may be expressed by the equation $$X_L = Z_0 \tan \frac{2\pi l}{\lambda}$$

where $l$=length of line in meters
$\lambda$=wave length in meters $Z_0$=characteristic impedance=$\sqrt{\frac{L}{C}}$
L=inductance per unit length of line
C=capacitance per unit length of line As the spacing between plates 1 and 2 of my invention is increased L increases because more magnetic lines of force can be encompassed by the hairpin-like loop formed by plates 1 and 2 and flexible connector 3. At the same time, C decreases because the strength of the electric field between plates 1 and 2 decreases as the two plates are moved farther apart. This causes a large change in $Z_0$ with a resulting large variation in $X_L$, the inductive reactance of my device.

The use in my device of flat plate conductors whose width is large compared to the spacing between conductors results in a very low characteristic impedance and hence a very low value of inductive reactance. Such a low reactance device is necessary to tune very low reactance loads of the type encountered, for example, in a large dielectric heater where the load electrodes are large and have a great deal of capacitance.

Figure 4:
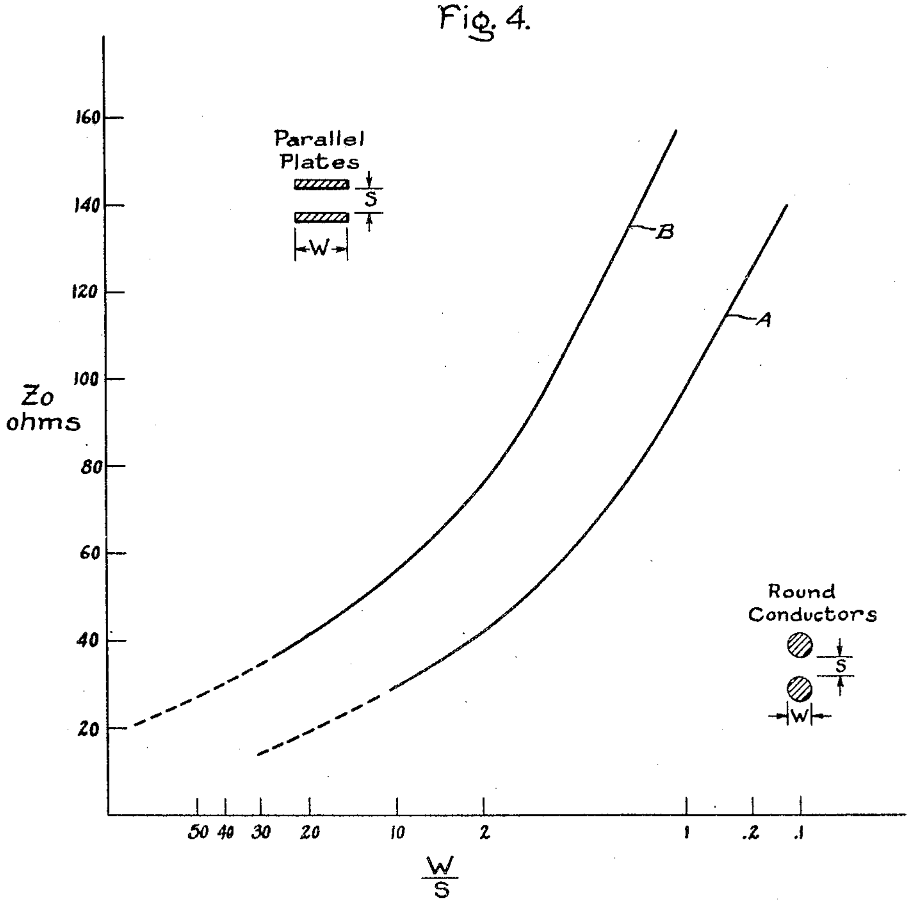

The use, in my invention, of flat plate conductors gives a much lower characteristic impedance than would result from the use of a short circuited section of parallel wire transmission line utilizing conventional round conductors of the same length. This is illustrated by Fig. 4 on the accompanying drawing in which curve A shows the variation in characteristic impedance, $Z_0$ with variation in the ratio of conductor width to conductor spacing for a typical apparatus embodying my invention, where $w$=width of plates 1 and 2
$s$=space between plates 1 and 2

The ratio $w/s$ is plotted logarithmically on the horizontal axis and the characteristic impedance, $Z_0$, is plotted on the vertical axis. Curve B in Fig. 4 shows the same variation for a comparable round conductor line. For this curve $w$=diameter of the round conductors
$s$=space between the two round conductors Curve B is a modification of the curve commonly shown in communication texts and handbooks for the variation of $Z_0$ with the ratio of round conductor diameter to spacing between centers. I have recalculated this, using the minimum space between the surfaces of the conductors instead of the space between the centers of the conductors, in order to make the resulting curve comparable to curve A of the device of my invention. It can be readily seen from the curves of Fig. 4 that the use of flat plate conductors gives a much lower value of characteristic impedance than conventional round conductors for any selected ratio of conductor width to conductor spacing.

The use of flat plate conductors also gives a large current carrying surface, with consequent low $I^2R$ loss. Furthermore, the large surface area is an effective heat dissipator making it possible to utilize large currents without the necessity of providing water cooling of the flat plate conductors.

While I have illustrated and described one embodiment of my invention, many modifications will occur to those skilled in the art and it should, therefore, be understood that I intend to cover by the appended claims any such modifications as fall within the true spirit and scope of my invention.

What I claim as new and desire to secure by Letters Patent of the United States is:

1. A variable high frequency reactance comprising two flat plates of electrically conductive material of substantially equal dimensions, the length of each said plate being less than one quarter wave length at a desired operating frequency, a flexible electrically conductive connection between said two plates at one end, means for supporting one said plate in a fixed position and means for varying the second said plate in parallel spaced relation with the first said plate.

2. A variable high frequency inductive reactance comprising two flat rectangular plates of electrically conductive material, said plates being of substantially equal length and width with said length being less than one quarter of the wave length of a desired high frequency, a flexible electrically conductive connection between one end of each of said plates, means for supporting one of said plates in a fixed position, means comprising a rack and pinion for varying the other of said plates in parallel spaced relation with said one plate, and means for connecting said plates to the two sides of a single phase high frequency electrical circuit.

3. A variable high frequency reactance comprising two parallel rectangular plates of electrically conductive material, said plates having substantially equal length and width, said length being less than one quarter of the wave length of said high frequency energy, said width being substantially greater than the width of conductors normally used to transmit energy of said high frequency, a flexible electrically conductive connection between one end of each of said two plates, said two plates and said flexible connection forming a transmission line having a length less than one quarter wave length with one end of said transmission line short circuited and the other end open, means for supporting one of said plates in a fixed position, means for varying the other of said plates in its parallel spaced relation with said one plate, said last-named means comprising a rack and pinion driven by an electric motor, and means for connecting said plates to the two sides of a single phase high frequency electrical circuit.

JULIUS VAHLE.

No references cited.